US010459334B2

(12) United States Patent
Lane

(10) Patent No.: US 10,459,334 B2
(45) Date of Patent: Oct. 29, 2019

(54) FACILITATION OF ORTHOTOPIC PATTERNS DURING SUBSTRATE FABRICATION

(71) Applicant: Tokyo Electron Limited, Minato-ku, Tokyo (JP)

(72) Inventor: Barton G. Lane, Austin, TX (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 15/439,723

(22) Filed: Feb. 22, 2017

(65) Prior Publication Data

US 2018/0240720 A1 Aug. 23, 2018

(51) Int. Cl.
| | | |
|---|---|---|
| H01L 21/027 | (2006.01) | |
| H01L 21/66 | (2006.01) | |
| G03F 1/42 | (2012.01) | |
| G03F 7/20 | (2006.01) | |

(52) U.S. Cl.
CPC ............ *G03F 1/42* (2013.01); *G03F 7/70625* (2013.01); *G03F 7/70633* (2013.01); *H01L 21/0274* (2013.01); *H01L 22/12* (2013.01)

(58) Field of Classification Search
None
See application file for complete search history.

(56) References Cited

U.S. PATENT DOCUMENTS

| 4,724,320 A * | 2/1988 | Ino ...................... G01N 23/225 250/307 |
|---|---|---|
| 7,386,162 B1 * | 6/2008 | Dakshina-Murthy ........................ B82Y 10/00 382/144 |
| 2003/0173833 A1 * | 9/2003 | Hazelton ............. G03F 7/70716 310/12.06 |
| 2004/0040930 A1 * | 3/2004 | Tanaka ................. G01N 23/225 216/61 |
| 2009/0004572 A1 * | 1/2009 | Choi ................... G03F 7/70433 430/5 |

* cited by examiner

*Primary Examiner* — Jay C Chang
(74) *Attorney, Agent, or Firm* — Oblon, McClelland, Maier & Neustadt, L.L.P.

(57) ABSTRACT

Described herein are technologies to facilitate the fabrication of substrates, such as semiconductor wafers. More particularly, technologies described herein facilitate the correct placement of patterns of lines and spaces on a substrate. The resulting patterned substrate is the product of photolithography process and/or the pattern transference (e.g., etching) that occurs during the fabrication of substrates (e.g., semiconductor wafers). The scope of the present invention is pointed out in the appending claims.

13 Claims, 5 Drawing Sheets

(background)

(background)

FACILITATION OF ORTHOTOPIC PATTERNS DURING SUBSTRATE FABRICATION

BACKGROUND

There are many steps involved in the typical fabrication of substrates, such as semiconductor wafers. More particularly, substrate fabrication often involves photolithography (or more simply "lithography") and/or pattern transfer using such lithography.

For example, the photolithography during a typical fabrication of a semiconductor wafer involves the deposition of a layer or several layers followed by the deposition of a layer which is sensitive to light. The photosensitive material (i.e., "photoresist") is then exposed to light which has been patterned by an optical system, typically by projection through a mask. The light interacts with the photosensitive material and changes its solubility properties in a developing solution such as an aqueous base solution. Either the exposed or the unexposed portion is then removed by dissolution in the developing solution leaving a patterned photosensitive layer.

This patterned layer then serves as a mask for the pattern transfer process. That process usually involves the removal of the underlying material (e.g., etching), deposition of material, or the mask for implantation by ions.

It is common for a sample of the manufactured wafers to be measured and examined after one or more of these steps to confirm that it falls within an acceptable range of post-step error or non-uniformity. One of the things that is often tested is the resulting pattern of lines and spaces on the surface of a substrate. Herein, that is called a patterned wafer or simply a pattern.

Of course, during the fabrication process these lithography and pattern transfer actions are repeated many times with differing patterns for each layer. These stacks of multiple ultimately form three-dimensional (3D) electrical structures, components, and devices.

The resulting pattern is tested to determine if there is an error in some part of the processes and/or otherwise some non-uniformity. Conventional technology typically measures the critical dimensions (CDs) of the lines of a pattern to decide about error or non-uniformity. The CD of a line typically includes line width (LW) and/or line-edge roughness (LER). Because the CD/LER is the key to the conventional approach to these determinations, this technology is typically called critical dimension (CD) metrology.

Because of the extraordinarily small scale of the pattern of lines and spaces, a scanning electron microscope (SEM) is typically used with CD/LER metrology. Consequently, a SEM used for this task is called a CD-SEM.

A conventional CD-SEM uses an electron beam to form images of microscopic features of a patterned wafer at extremely high magnification. Traditionally, such CD-SEMs generate output that informs the human users about the CDs of the patterned wafer. Based on this information, the users decide whether the patterned wafer meets specifications. If it does not, then the users determine what tasks need to be taken to adjust the wafer manufacture process to ameliorate the error or non-uniformity.

BRIEF DESCRIPTION OF THE DRAWINGS

The Detailed Description references the accompanying figures. In the figures, the left-most digit(s) of a reference number identifies the figure in which the reference number first appears. The same numbers are used throughout the drawings to reference like features and components.

DETAILED DESCRIPTION

Figure 1:
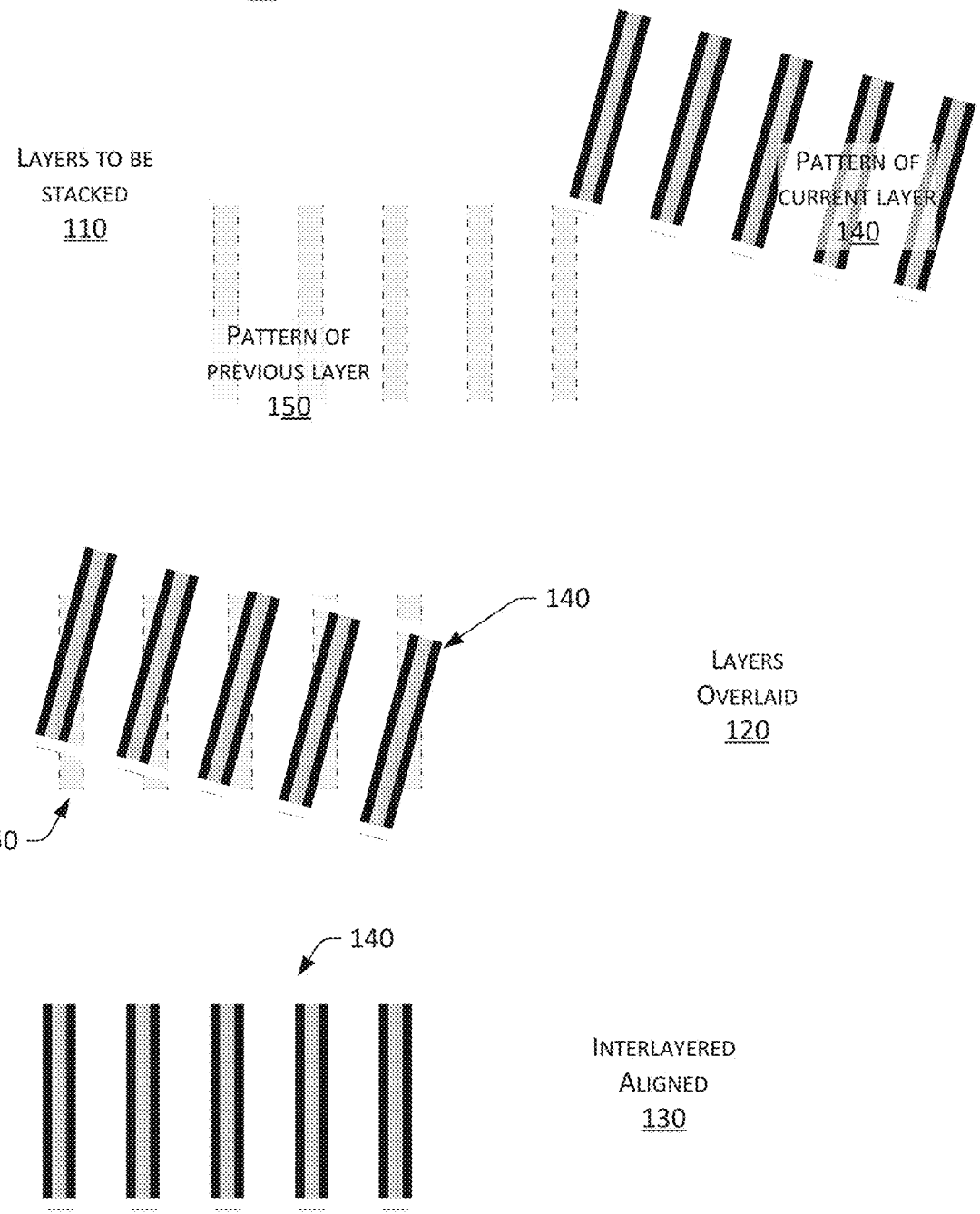
FIG. 1 shows an example scenario 100 that illustrates an interlayer alignment. This is provided to contrast with intralayer alignment.

Described herein are technologies to facilitate the fabrication of substrates, such as semiconductor wafers. More particularly, the technologies described herein facilitate the correct placement (i.e., orthotopicness) of patterns of lines and spaces on a substrate. The resulting patterned substrate is the product of photolithography process and/or the pattern transference (e.g., etching) that occurs during the fabrication of substrates (e.g., semiconductor wafers).

Conventional Alignment Approaches

During the typical wafer fabrication, photolithography (i.e., lithography) is used to produce a three-dimensional (3D) relief image of a pattern of lines and spaces onto a layer or film on a surface of a wafer for a subsequent transfer of that pattern to the wafer. The pattern is typically applied as a light sensitive polymer called photoresist. The photoresist is intended to be temporary. It is removed once the desired pattern is permanently applied to the layer.

After the lithography process, the photoresist pattern is permanently transferred into or onto the layer itself. One of three types of pattern transference are used: 1) subtractive transfer (e.g., etching), additive transfer (e.g., selective deposition), and impurity doping (e.g., ion implantation). By far, the most common type is subtractive transfer or etching.

Typically, etching is either wet or dry. A wet etch involves the use of chemicals such as acids. A dry etch—which most common—involves the use of plasma. The photoresist effectively "resists" the etching and protects the material covered by the photoresist. When the etching is complete, the resist is washed away leaving only the desired pattern etched into the surface of the layer.

To build the complex circuitry of modern semiconductor devices, multiple layers of materials having various electrical properties are stacked on each other within a wafer. Each layer has its own pattern of lines and spaces applied and etched—via the lithography and etch-pattern transfer processes.

Multiple layers are connected by vertical electrical connections to form an electrical network which may contain non-linear electrical elements. The network and the non-linear elements make up the core of a functioning electrical system which may have logic functions or memory functions or a combination of the two. For such a network to function electrically, it is necessary that connections be made correctly between layers. This requires features such as lines to be accurately placed on the wafer relative to other previously placed lines and relative to other lines which are being patterned at the same time. If features are not correctly placed, the network may not function electrically as intended and the subsequent part be worthless commercially.

With typical wafer fabrication, there are two types of alignment. interlayer and intralayer. Interlayer alignment or overlay alignment promotes alignment between stacked layers, especially immediately stacked neighbors. For example, during the lithography process of each layer, the image of a mask is aligned with the previously transferred patterns of layer(s) of the wafer. Typically, fiducial marks are used to aid in the interlayer alignment.

FIG. 1 shows an example scenario 100 that illustrates an interlayer alignment. This example scenario 100 may be read from the top down. The scenario 100 starts with layers to be stacked 110. That is followed by an illustration of the layers overlaid 120. And it ends with a depiction of the layers aligned in an interlayered sense at 130.

In the layers to be stacked 110 portion of the illustration, a pattern of the current layer 140 is shown separately and unaligned with a pattern of a previous layer 150. Presumably, the pattern of the previous layer 150 is already transferred to the wafer. To make the best resulting circuitry, the pattern of the next (or in this case the current) pattern should be aligned to the pattern of the previous layer 150.

At the next layers overlaid 120 section of the illustration, the pattern of the current layer 140 is shown overlaying the pattern of the previous layer 150. However, the two patterns are not yet aligned.

At the bottom illustration (interlayered aligned 130), only the pattern of the current layer 140 is visible because it is aligned with (and thus obscuring) the pattern of the previous layer 150.

The illustrations of FIG. 1 help explain the function and benefit of the interlayer alignment. However, the interlayer alignment technique can only work if the applied/transferred patterns of each layer are themselves properly aligned on/in its own layer—within a given tolerance. That is, is the pattern on/in a given layer in its proper place on/in the layer. This type of alignment is called the intralayer alignment.

Figure 2:
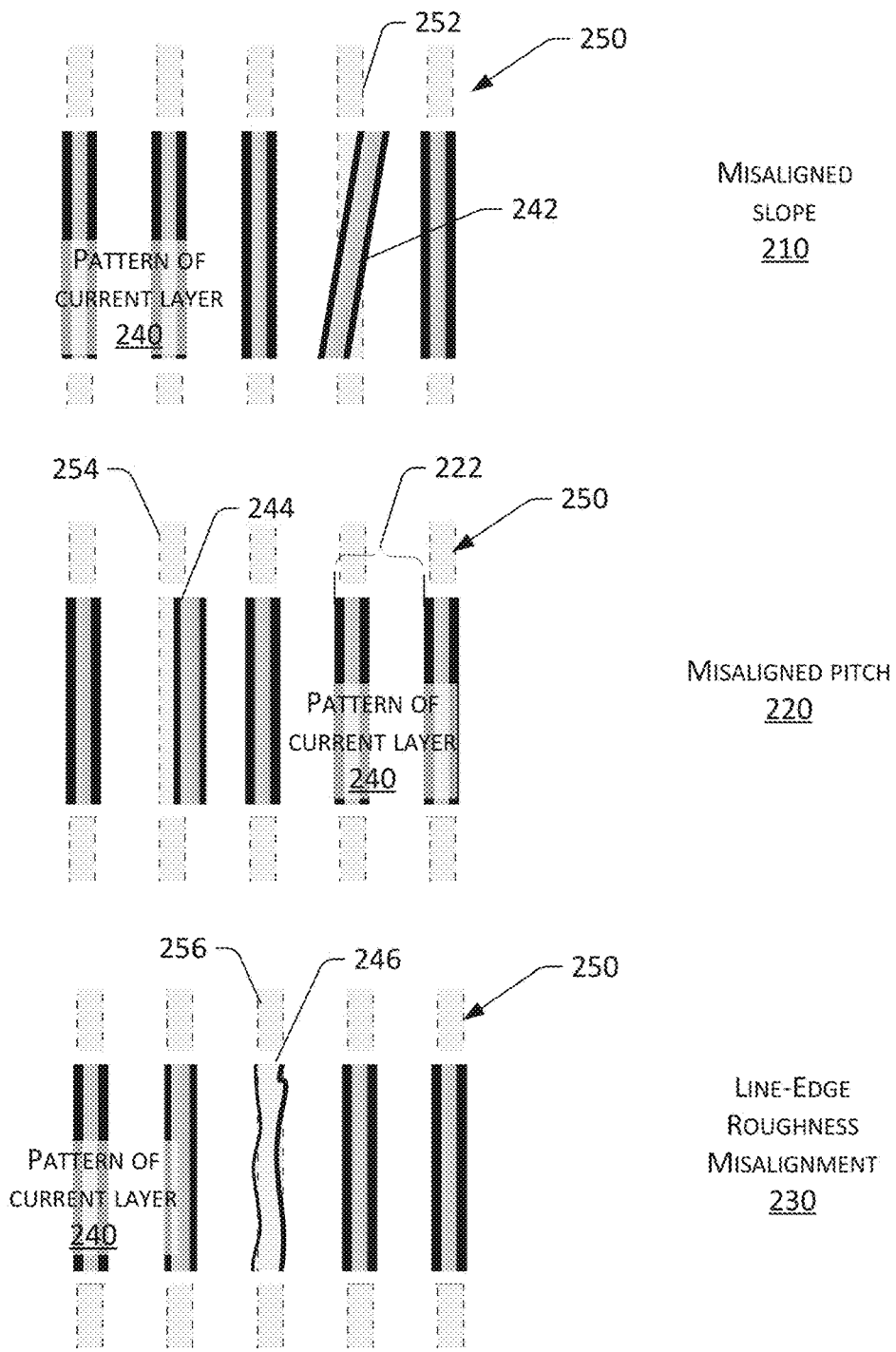
FIG. 2 shows three example scenarios that illustrate intralayer misalignment. This illustrates the problem addressed by one or more implementations of the technology described herein.

FIG. 2 shows three example scenarios that illustrate intralayer misalignment: misaligned slope 210, misaligned pitch 220, and line-edge roughness misalignment 230. This illustrates examples of the problem addressed by one or more implementations of the technology described herein.

Each scenario depicts a pattern 240 of lines of a current layer of a patterned wafer superimposed over a dashed outline 250 of where the lines of that pattern should be in/on that patterned layer. In other words, the dashed outline 250 shows the orthotopic (i.e., "right placement") of the lines of the pattern that should have been applied onto or transfer into the current layer of the wafer.

The misaligned slope 210 scenario shows a single line 242 of the many lines of the current-layer pattern 240 that is misaligned relative to the other lines. More particularly, line 242 has a different slope that its orthotopic line 252. The slope of a line is its angle. The slope is often measured from its idealized vertical alignment. Note that a simple rotation or translation of the current layer 240 will not correct this misalignment except at the cost of introducing misalignments in other lines of the pattern; the misalignment is due to the intralayer misalignment and not due to the interlayer alignment.

The misaligned pitch 220 scenario shows a single line 244 of the many lines of the current-layer pattern 240 that is misaligned relative to the other lines. More particularly, line 244 shifted over from where its orthotopic line 254 would be. Thus, the pitch between the actual lines in the current-layer pattern 240 differs from the pitch of the orthotopic lines.

The pitch is the distance from one edge to the same type of edge of adjacent lines. For example, the misaligned pitch 220 scenario shows pitch 222 between the left edge of one line to the left edge of the adjacent line of the current-layer pattern 240.

The line-edge roughness (LER) misalignment 230 scenario shows a single line 246 of the many lines of the current-layer pattern 240 that is misaligned relative to the other lines. More particularly, the LER of the line 246 differs significantly from the ideally straight edges of the orthotopic line 256.

Of course, other types of intralayer misalignment may occur. These scenarios are merely provided as examples of such a misalignment so as to illuminate the problem. If just one layer out of a hundred intralayered misaligned, then the resulting devices of that wafer that fail to function or fail to meet specifications.

With conventional approaches, intralayer alignment is based upon measures of the critical dimensions (CDs) of the lines of a pattern on/in a layer. The CD of a line typically includes line width (LW) and/or line-edge roughness (LER). Because the CD is the key to the conventional approach to these determinations, the technology that measures the CD is typically called critical dimension (CD) metrology.

Because of the extraordinarily small scale of the pattern of lines and spaces, a scanning electron microscope (SEM) is typically used with CD metrology. Consequently, a SEM used for this task is called a CD-SEM.

A conventional CD-SEM uses an electron beam to form images of microscopic features of a patterned wafer at extremely high magnification. Traditionally, such CD-SEMs generate output that informs the human users about the CDs of the patterned wafer. Based on this information, the users decide whether the patterned wafer meets specifications. If it does not, then the users determine what tasks need to be taken to adjust the wafer manufacture process to ameliorate the misalignment. The judgment as to the whether the CD of the patterned wafer meets specifications may also be performed automatically.

Conventional Intralayer Alignment Metrology

The conventional approach to intralayer alignment metrology captures images of patterns of lines and spaces on a patterned wafer using the CD-SEM. Each image is scanned, and the edges of the lines are detected, and lines (e.g., vectors of the lines) are plotted. The image, which is an array of grayscale values, is analyzed by scanning horizontally across each row of pixels applying an edge detection algorithm to detect which pixels are at the "edge" of the line which can be formed in photoresist or in the underlying substrate after etching. The "edge" of the line is denoted by two numbers: the horizontal or x value and the vertical or y value. A set of these x,y pairs is a complete characterization of the edges of all the lines in the image. The number of lines may vary depending on the line width, pitch and image magnification.

This set of x,y pairs can be segregated into pairs which belong to a particular edge, for example, the left edge of the fourth line from the left in the image. This set of x,y pairs represents the best experimental determination of the location of the edge.

For each given individual line, the conventional CD-SEM fits an imaginary straight line to that line. A straight line is fit to the set of x,y pairs such that the sum of the squares of the displacements of the points from the line is minimized.

Since the lines are almost vertical, the displacements of the points from the fitted line can be estimated by only considering the x value of the x,y pair and comparing it to the x value predicted by the fitted straight line.

Each line has two free parameters, which are the slope and offset (from the edge of the frame of the image). The conventional CD-SEM calculates the minimum of the sum of the squares of the residuals for that particular line over the two free parameters to find the idealized values of these two parameters. This is the "fitting of a line" to the particular line.

Typically, each edge is fitted by a separate straight line. A particular line is considered to be intralayered aligned when its deviation of its actual measurements from its fitted line is small and falls within a defined range or below a given threshold. Therefore, the conventional approach presumes that a pattern with a sufficient number of "straight" lines implies that the overall pattern is aligned in an intralayered sense.

However, consider the misaligned slope 210 scenario, where the line 242 of the patterned wafer is perfectly smooth and straight, but it has a different slope from another line in the image. In this scenario, the variance of the data may be formally zero because each edge is fitted to a straight line with independent parameters. Each line is considered straight and smooth. Consequently, the conventional approach will declare the pattern to be aligned in an intralayered sense. However, that is not so. The lines differ in slope. Line 242 is not where it should be. This may lead to a faulty or defective device or component.

The technology described herein challenges the conventional assumption that pattern of "straight" lines implies intralayered alignment of the overall pattern. Indeed, rather than relying on measurements of individual lines taken separately, the new technology described herein takes into consideration the relationship amongst the lines of the patterns in making an alignment determination.

Example Orthotopic Pattern Metrology System

Figure 3:
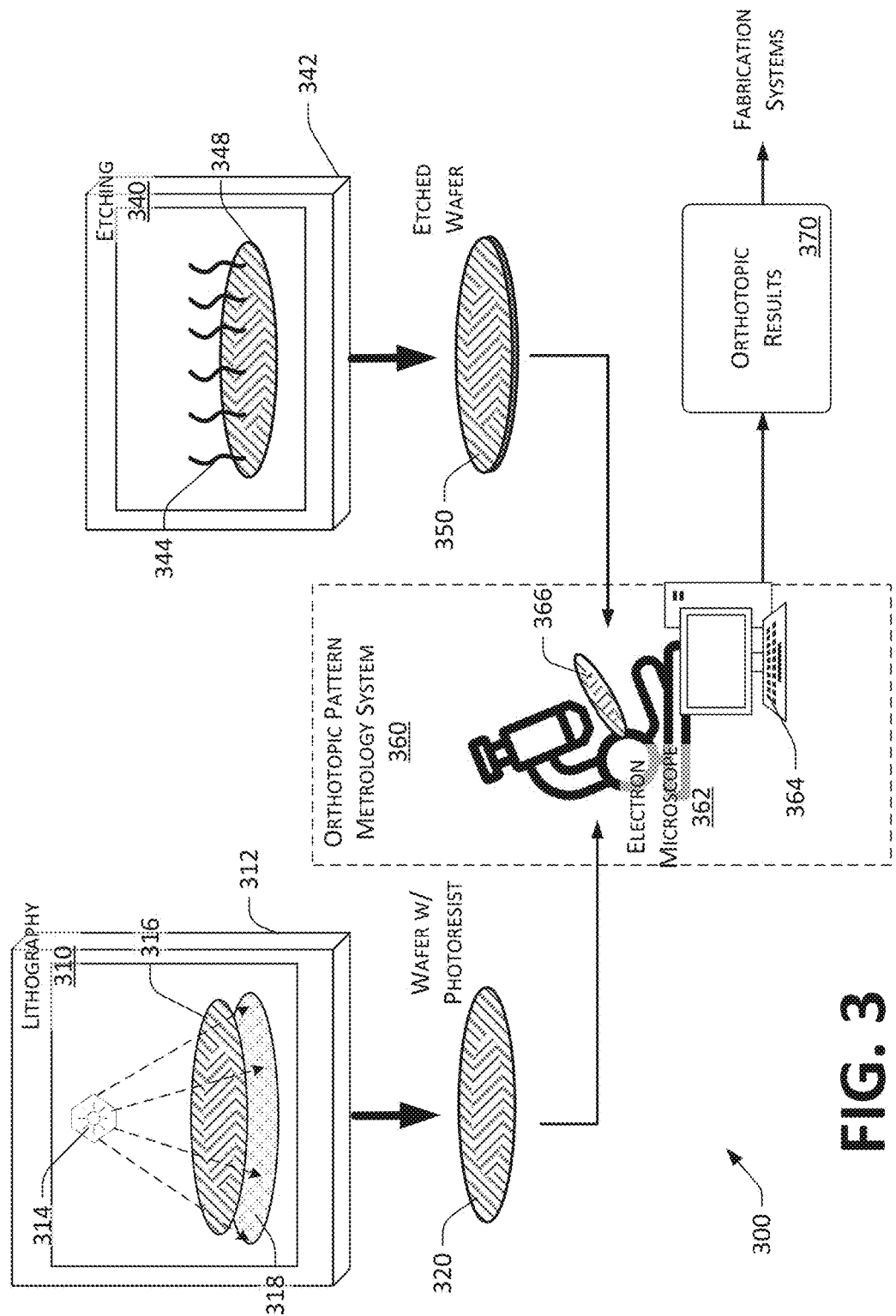
FIG. 3 illustrates an example scenario in which one or more implementations of the technology described herein may be incorporated.

FIG. 3 illustrates an example scenario 300 in which one or more implementations of the technology described herein may be incorporated. The example scenario 300 includes an orthotopic pattern metrology system 360 and two relevant portions of the fabrication system of a semiconductor wafer, which is an example of a substrate fabrication contemplated for use with the technology described herein.

As used herein, the term orthotopic is used to refer to the "correct placement" of a pattern of lines and spaces. In particular, as used herein, orthotopic refers to correct intralayer alignment of a pattern of lines and spaces on/in a layer of a substrate. For example, an orthotopic line is a line in the right place on/in a layer on a wafer. A system that measures a pattern on/in a layer on a wafer to determine its orthotopicness is performing orthotopic metrology.

The relevant portions of the fabrication system include a lithography section 310 and an etching section 340. These sections of this fabrication system are merely intended to represent the portions of a typical fabrication that are most relevant to the example implementation related to this figure. It does not represent all sections or portions of a suitable fabrication for this or other implementations of the technology described herein. Furthermore, the order of the sections of the fabrication system is offered for illustration purpose only, and it does not represent any required or necessary order for this or any other implementation.

As depicted, the lithography section 310 includes a lithography chamber 312, light source 314, photomask 316, and unpatterned wafer 318. For the purposes of the technology described herein, the photolithography process that occurs in the lithography section 310 is consistent with conventional photolithography processes and technology.

In short, light from the light source 314 is used to transfer a geometric pattern from the photomask 316 to a light-sensitive chemical photoresist on the previously unpatterned wafer 318. This produces a patterned wafer. More particularly, the patterned wafer is a wafer 320 with a pattern of photoresist thereon. Herein, this may be called a photoresist patterned wafer 320.

The photoresist patterned wafer 320 is delivered to the orthotopic pattern metrology system 360 to determine if the patterns thereon are intralayered aligned. In this instance, the layer being considered is the photoresist layer. Herein, this is called post-lithography or photoresist pattern intralayer alignment orthotopic metrology.

As depicted, the etching section 340 includes an etching chamber 342, plasma 344, and photoresist patterned wafer 348. For the purposes of the technology described herein, the etching process that occurs in the etching section 340 is consistent with conventional etching processes and technology.

In short, the plasma 344 removes material from the surface of the photoresist patterned wafer 348 that are not protected/covered by the photoresist pattern. The plasmas of the process gasses convert the material to be etched from the solid to the gaseous phase, and a vacuum pump extracts the gaseous products. The use of the photomasks ensures the etching of only the exposed parts of the surface of the photoresist patterned wafer 348. This produces an etched wafer 350. That is, a wafer with a pattern etched into its surface is produced by the etching section 340.

The etched wafer 350 is delivered to the orthotopic pattern metrology system 360 to determine if the patterns therein are intralayered aligned. In this instance, the layer being considered is the most recently deposited layer; that is, the layer that forms the surface of the wafer. Herein, this is called post-transfer pattern intralayer alignment orthotopic metrology.

The etching described here with the example scenario 310 is just one example of pattern transfer that is suitable for one or more implementations of the technology described herein. Other forms of pattern transfer may be employed (e.g., additive transfer or impurity doping). Indeed, the plasma etching described here with the example scenario 310 is just one example of a subtractive transfer that is suitable for one or more implementations of the technology described herein. Other forms of subtractive transfer may be used (e.g., chemical).

Depending upon the implementation and the point in the fabrication process, the orthotopic pattern metrology system 360 receives and tests a pattern-transferred wafer 366, which is either the photoresist patterned wafer 320 or the etched wafer 350. Therefore, depending on which type of wafer that is being tested, the system 360 is performing either post-lithography pattern intralayer alignment orthotopic metrology or post-transfer pattern intralayer alignment orthotopic metrology. Regardless, the system 360 is performing some form of intralayer alignment orthotopic pattern metrology.

The orthotopic pattern metrology system 360 includes a scanning electron microscope (SEM) 362 and computing system 364. For the sake of simplicity, the SEM 362 is represented as an optical microscope to convey the use of a mechanism to see at scales well below what is capable with the unaided human eye. That said, a scanning electron microscope is used because of the extraordinarily tiny scale of the lines being transferred to the wafer during the fabrication process. For example, the lines of a pattern may be separated by only 32 nanometers (nm) or less.

The SEM 362 generates multiple images of the patterned surface of the pattern-transferred wafer 366. The computing system 364 takes several measurements of the patterns in the images and analyzes those measurements and images to determine whether the patterns on the pattern-transferred wafer 366 are intralayered aligned using an implementation of the technology described herein. See FIG. 5 and its accompanying text for additional discussion on the measurements and analysis. The computing system 364 produces orthotopic results 370.

Those results may be formatted for presentation to a human user via a user interface (UI). The computing system 364 may use audio and/or visual (A/V) elements to audibly and/or visually represent alignment or misalignment of the lines and spaces of the pattern on the pattern-transferred wafer 366. The degree of alignment or misalignment may be represented by numerical values, audio feedback, and/or graphical representations.

Alternatively, these results may be packaged into the form of instructions and fed back into the functional components of the fabrication system. These instructions may direct a change in the fabrication process itself to ameliorate the misalignment of the patterns when that same layer is fabricated on another wafer. Alternatively, when the misalignment is within a defined tolerance range, the instructions may adjust the alignment of subsequent patterns so that they better match a "misaligned" pattern.

Methodological Implementations

Figure 4:
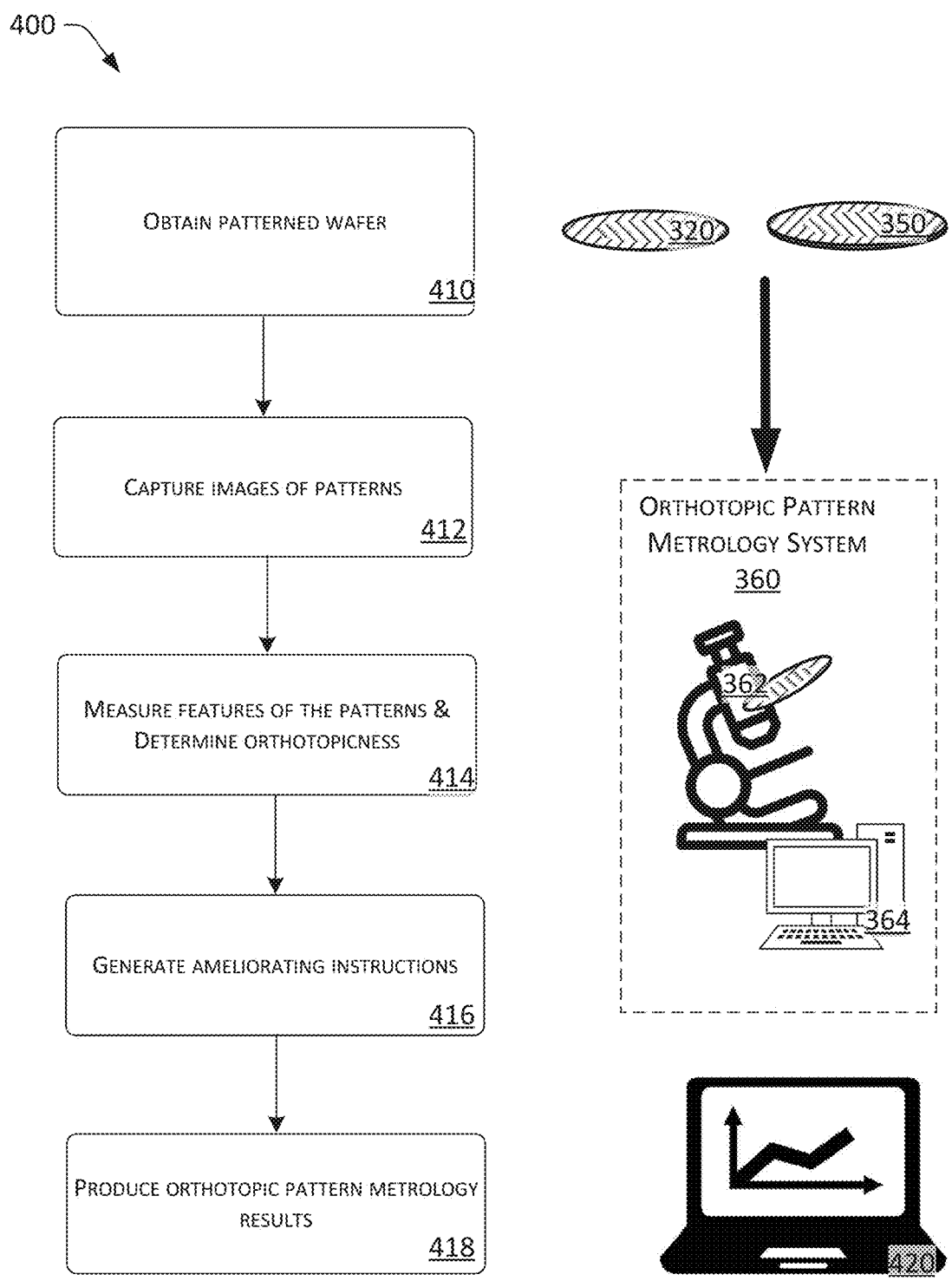
FIG. 4 provides a flow chart illustrating a method for orthotopic pattern metrology in accordance with the technology described herein.
Figure 5:
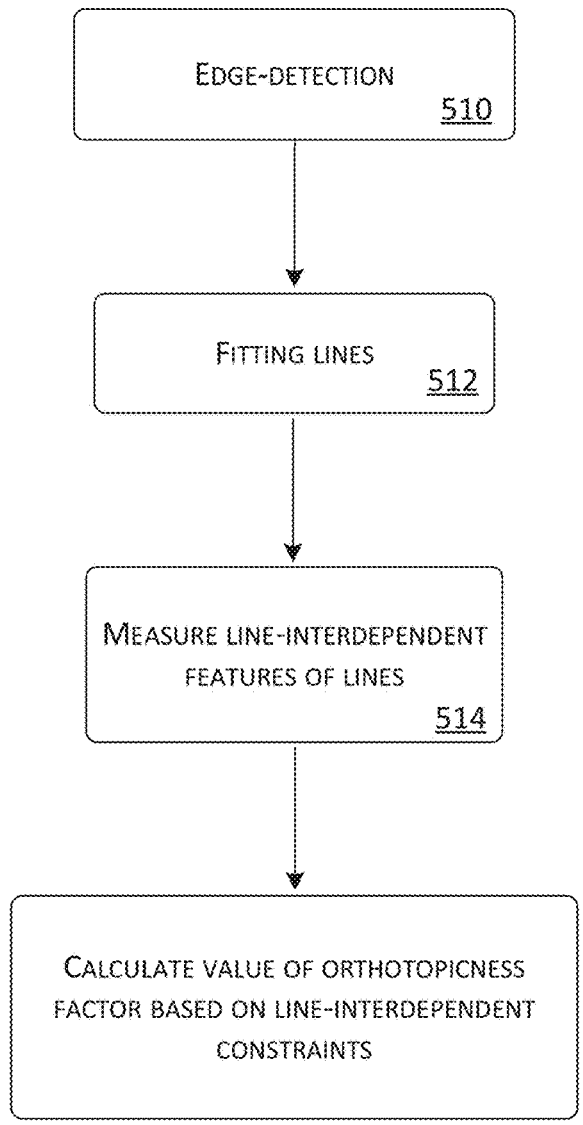
FIG. 5 provides a flow chart illustrating a method for orthotopic pattern metrology in accordance with the technology described herein.

FIGS. 4 and 5 illustrate example processes for an implementation of orthotopic pattern metrology as described herein. These processes may be performed, at least in part, by the orthotopic pattern metrology (OPM) system 360 or by a suitable computing system. For the sake of simplicity, the OPM system will be described as performing the operations of these example processes.

The example process 400 illustrates an implementation of the overall orthotopic pattern metrology as described herein. The example process 500 illustrates additional details of portions of the example process 400.

At 410, the OPM system obtains a patterned wafer, such as the pattern-transferred wafer 366. Typically, this obtained wafer may be either the photoresist patterned wafer 320 from the lithography process or the etched wafer 350 from the etching process. This may be described as the OPM system obtaining the patterned substrate after photolithography or pattern transfer; obtaining the image includes capturing the image of the patterned substrate.

At 412, the OPM system captures one or more images of the patterned wafer. Thus, the OPM system captures the images of one or more patterns of the patterned wafer. This is typically accomplished using a scanning electron microscope, such as SEM 362. This may be described as the OPM system obtaining one or more images of one or more patterns of lines and spaces on a patterned substrate (such as a semiconductor wafer).

At 414, the OPM system measures features of the pattern(s) of the image(s), fits lines to the lines of the patterns, and determines orthotopicness of the pattern(s). The measured features include line-independent features and line-interdependent features. That is, some features are independent of other lines, and some features depend on other lines. This may be described as the OPM system measuring features of the lines of the pattern. The measured features include one or more line-independent features and one or more line-interdependent features.

A line-independent feature is a measurable characteristic that is specific to a particular line. These features are associated with particular lines and are unassociated and unaffected by other lines of the pattern. The relationship between lines is irrelevant to line-independent features.

Examples of line-independent features include the conventional CDs measured by the conventional intralayer alignment approaches. For each line, the conventional CDs provide a measure or calculation of that line's width (LW) and that lines line edge roughness (LER). The CD measurements and/or calculations for each particular line are wholly unaffected by the CDs of any other line in the patterns. Indeed, any measurement or calculation of characteristics of a single line alone is by its nature line-independent feature.

A line-interdependent feature is a measurable and/or calculable characteristic that is based on the relationship between two or more lines. These features are inherently associated with and affected by multiple lines in one or more patterns. The relationships between lines are relevant to line-interdependent features. Indeed, their relationship is the subject of what is being measured and/or calculated.

An example of line-interdependent features is the pitch between the lines. The pitch is the distance from one edge to the same type of edge of adjacent lines. By its nature, the pitch measurement is one about the relationship between adjacent lines. Another example of line-interdependent features is the difference in slope between lines.

With operations of block 414 of this example process 400, the OPM system measures both line-independent and line-interdependent features of the pattern(s) of the images. For an image, the OPM system determines the constant horizontal offset (i.e., "offset" herein) for the pattern. The OPM system determines the distance of the left edge of the far-left line of the pattern from the edge of the image itself. Of course, in some implementations, it may be the right edge of the far-right edge. Regardless, the offset is based on the edge of a selected line from a fixed edge.

The OPM system determines the difference in slope between lines. While the slope itself for each line is a line-independent feature, the difference in slope between lines is a line-interdependent feature. In making its orthotopicness calculation, the OPM system presumes that all of the orthotopic lines have a common slope. Thus, the orthotopic lines are parallel to each other. Furthermore, that common slope of the orthotopic lines is presumed to be zero or vertical.

The OPM system also measures the pitch between the lines of the pattern. This is a line-interdependent feature. In making its orthotopicness calculation, the OPM system presumes that the pitch between the orthotopic lines should be same between each line. That is, the pitch between adjacent lines should not change in the orthotopic lines.

To calculate the orthotopic factor, the OPM system utilizes both measured line-independent feature and line-interdependent features. In addition, the OPM system presumes line-interdependent features about the lines of an orthotopic pattern. Thus, in calculating the orthotopicness of the patterns, the OPM system presume line-interdependent features, such as a consistent pitch between lines, each line has the same CD, and a common slope shared by all lines. Of course, a common slope means that the lines are parallel to each other. This may be described as the OPM system calculating an orthotopicness factor based, at least in part, on the one or more line-interdependent features and employing one or more line-interdependent constraints. The orthotopicness factor is indicative of a relative degree of orthotopicness of the pattern of lines and spaces of the image.

At 416, the OPM system generates ameliorating instructions based on the results of operations at block 414. The instructions might include, for example, directions for adjusting any part of the photolithography process. For example, the instructions may adjust amount or type of photoresist that is applied. The instructions may, for example, direct a change in the prebake of the photoresist. Other types of instructions may be directed towards adjusting the pattern-transfer process (e.g., etching process).

This may be described as the OPM system generating instructions to adjust substrate fabrication of the substrate fabrication system, wherein the generated instructions direct a sub-system of the substrate fabrication system to improve orthotopicness of a pattern of lines and space of a layer of a substrate during its fabrication.

These instructions may be derived from a database of correlation between calculated misalignment and potentially ameliorating actions. This database can be created using human-based tests and/or machine-learning systems using the data derived from such test.

At 418, the OPM system produces results. The results may include data regarding the orthotopicness of the patterns and/or the generated instructions. If the results include the generated instructions, then those instructions are forwarded to sub-systems of the fabrication system. The may be described as the OPM system presenting the calculated orthotopicness factor.

The display of the mobile computer 420 may display the results graphically, audibly, and/or as numerical values. For example, the display may show a numerical value of the calculated orthotopicness of the patterns of one or more images of the patterned wafer. This value may be associated with a range or threshold of being "in spec" or not. A visual aid (e.g., color, graphics, bars, etc.) may be used to illustrate the degree of misalignment.

The information from the mobile computer system may indicate that the OPM system has determined that a value of the calculated orthotopicness factor indicates that the pattern of lines and spaces on the patterned substrate falls outside of the specified range of values to be considered intralayered aligned. And, in response to the determining. The OPM system presents an indication that the patterned substrate is misaligned. The presenting discussed here may include audible and/or visual indication of the relative degree of orthotopicness as indicated by the calculated orthotopicness factor.

Example process 500 of FIG. 5 illustrates additional details of the operations of block 414. For the discussion of this example process 500, consider the use of a single SEM image, which is an image captured by a SEM of a pattern of a patterned wafer. The SEM image is a two-dimensional ("2D") array of grayscale values for each pixel indexed by (i,j) where i indexes horizontally and j indexes vertically.

Take for convenience, the origin to be at the lower left-hand corner of the SEM image. Thus, the grayscale value at pixel (i,j) would be G(i,j). The SEM image is an image of a field on a wafer or coupon. For the sake of simplicity, consider that the SEM has been calibrated so that the position of any pixel in the image is known. For example, the pixel (i,j) is at a point $x_i$ horizontally to the right of the left-hand side of the image and $y_i$ vertically above the bottom edge of the image; that is the pixel (i,j) is at the point $(x_i, y_i)$ where $x_i$ and $y_i$ are measured from the lower left-hand corner of the image.

For the discussion of this example process 500, assume that the position of the lower left-hand corner of the SEM image relative to the physical wafer or coupon is not known, nor is the orientation of for example the left of the SEM image relative to any feature on the physical wafer or coupon.

For this discussion, the lines of the pattern of the SEM image are oriented approximately vertically and that the SEM image is also oriented approximately vertically. This is done merely to make the explanation easier and not as a requirement for an implementation.

At 510, the OPM system performs edge-detection on the pattern of the SEM image. The edges are vectors. Each line has a left and a right edge. As the name implies, the edge detection detects the edges of a line in the pattern of the SEM image. That is, the OPM may be described as detecting edges in the SEM image.

The edge detection is typically done by scanning across a horizontal row of pixels and matching a pattern to the pattern of grayscale values of the horizontal row of pixels and identifies as left and right edges. As part of the edge-detection, the OPM system scans along, for example, row j, it determines a horizontal index $i=i_*$, which corresponds to an edge of a particular line. This edge is labeled by the integer n where n=1 corresponds to the left edge of the first line on the left of the image and n=2 corresponds to the right edge of the first line of the image. The coordinates of this point on the SEM image are $(x_{i_*}, y_j)$. The horizontal distance from the left edge of a point on the $j^{th}$ row corresponding to the n edge of the image is denoted as $x_e^n(j) = x_{i_*}$. The 1D array of points $x_e^n(j)$ j=1, 2, ... $j_{max}$ gives the position of the $n^{th}$ edge on the SEM image.

At 512, the OPM system designates lines. That is a line is fitted to the detected edges. A line identified by fitting a line to pairs of adjacent parallel edge vectors. Once the edges are detected, the lines are fitted to those edges. This represents the physical knowledge that the ideal line as defined by the mask which produced the lithographic pattern is perfectly straight. For this, the OPM may be described as simultaneously fitting straight lines to adjacent pairs of the detected edges using one or more line-interdependent constraints.

Fitting a straight line to the edges will tell how much a typical point on the line edge is separated from the straight line which best fits that edge. The equation of a line is x=a+by, where b represents the slope of the line as measured from the vertical; thus, if b=0 the line is defined by x=a where a is a constant and the line is perfectly vertical. The x coordinate of a point on the line a distance $y_j$ above the lower edge of the SEM image would be $x = a + by_j$. The horizontal distance between edge n detected on row j and the line is $D(j,n) = x_e^n(j) - (a + by_j)$. The approach assumes an approximation that the lines are nearly vertical and so the perpendicular distance of the point on edge of the line is given by the horizontal distance of the point on edge of the line. This approximation is not essential to the method, but simplifies the exposition given here. One skilled in the art could extent this method trivially to a situation in which the lines imaged by the SEM where at a finite angle relative to the left edge of the image.

The OPM system fits a line to the edge by minimizing the square of the distance of the detected edge points from the line. Using the approximation above that the line is nearly vertical, the quantity $S^n$:

$$S^n = \frac{1}{j_{max}} \sum_{j=1}^{j_{max}} (x_e^n(j) - (a + by_j))^2 \qquad \text{Equation 1}$$

over the two unknown parameters a and b. The methods for minimizing the quantity $S^n$ are well known and will not be detailed here.

In some of the conventional approaches, the line fitting is done separately for each line. Unlike those approaches, this implementation of the technology described herein performs line fitting across multiple lines.

If there are m lines in the SEM image and therefore 2n edges, the method whereby each line is fitted separately to a straight line gives a total of 4n parameters which are fit. Typically, after a line is fit, a measure of the roughness of the line given by the $S^n$ with the minimizing values of a and b. If one assumes that the distances of individual points from the line are given by a Gaussian probability distribution characterized by a standard deviation σ, then an estimate of that standard deviation is given by $\sigma_{single=}\sqrt{S^n}$. This standard deviation characterizes the probability that a point on the detected edge of a line will lie on a straight line which best fits that edge.

At 514, the OPM system measures both line-independent features and line-interdependent features of the multiple lines of a pattern of the image. For example, the OPM system measures the offset, CDs of lines (e.g., line width), pitch, and slope of the lines.

At 516, the OPM system calculates a value of an orthotopicness factor for the pattern of the SEM image. Several a priori facts are used to make this calculation: the lines of the pattern (1) are parallel, (2) have equal pitch and (3) have the same CD. That is, the calculation imposes constraints in the form of presumptions regarding the line-interdependent features of a pattern of orthotopic lines. In particular, those constraints include the (1) lines being parallel to each other, (2) adjacent lines having an equal pitch (i.e., separated by same distance), and (3) that each line has the same (and consistent) CD (e.g., line width).

These constraints are imposed on the simultaneous fitting of all the edges to a set of parallel lines with an equal pitch and equal CD. Instead of being simultaneous fitting, this may be viewed as cumulative fitting. This reduces the number of fitting parameters from 4n to just four: 1) b, which is the common slope of the set of lines, 2) P, which is the fitted pitch, 3) CD, which is the fitted CD, and 4) a, which is an arbitrary constant representing the common offset of the set of lines from the left edge of the image. More precisely, the following equation indicates the sum that is to be minimized:

$$S^{tot} = \frac{1}{m}\sum_{n_{odd}}\frac{1}{j_{max}}\sum_{j=1}^{j_{max}}\left(x_e^n(j) - \left(a + \frac{(n-1)}{2}P + by_j\right)\right)^2 + \frac{1}{m}\sum_{n_{even}}\frac{1}{j_{max}}\sum_{j=1}^{j_{max}}\left(x_e^n(j) - \left(a + CD + \frac{(n-2)}{2}P + by_j\right)\right)^2$$

Equation 2 where n odd corresponds to the left edges of lines and n even corresponds to the right edges of lines, and n=2m where m is the number of lines in the image. Equation 2 produces a value of the orthotopicness factor of the pattern(s) of one or more SEM images.

This set of parallel, equal pitch lines represents the best estimate as to the desired location of the line edges given the information on the SEM image and the prior knowledge that the lines are parallel and have an equal pitch. If we assume that the probability that a point on the edge of a line departs from the desired location of the line edge by an amount which is given by a Gaussian distribution characterized by a standard deviation a, then an estimate of that distribution is given by $\sigma_{tot}=\sqrt{S^{tot}}$. This deviation is larger than the standard deviation computed for a single line or the average of the standard deviations computed for a set of single lines since the fitting is constrained and there are less fitting parameters.

In short, the OPM system may be described as calculating orthotopicness factor based on the simultaneous fitting. The orthotopicness factor is indicative of a relative degree of orthotopicness of the pattern of lines and spaces of the SEM image.

The value of the orthotopicness factor is an indicator of the degree of relative orthotopicness of the pattern(s) of the image(s). That is, it is a measure for how closely the actual pattern matches the original pattern (e.g., from the photomask) as represented by an idealized orthotopic pattern. That idealized pattern presumed the line-interdependent constraints discussed herein. For example, the value of this factor is proportional with how misaligned the pattern is. This value may be calibrated to a scale that indicates the relative degree of orthotopicness of the patterned wafer.

For example, a value of zero to 1 may indicate an "aligned" and "in spec" pattern; a value of 1-2 may indicate a "mostly aligned" and marginally "in spec" pattern; and value over 3 may indicate a "misaligned" and "out of spec" pattern. The manufacturer may be able to sell wafers having only orthotopic factors in the "aligned" range for a premium price.

Additional and Alternative Implementation Details

"Substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, the substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Reference herein to "one embodiment" or "an embodiment" refers to one or more features, structures, materials, or characteristics described at least one example embodiment of the technology described herein. It does not denote or imply that the features, structures, materials, or characteristics are present in every embodiment. Thus, the appearances of the phrases "in one embodiment" or "in an embodiment" in various places throughout this document are not necessarily referring to the same embodiment of the technology. Furthermore, the features, structures, materials, or characteristics may be combined in any suitable manner in one or more embodiments.

In the above description of example implementations, for purposes of explanation, specific numbers, materials configurations, and other details are set forth to explain better the present invention, as claimed. However, it will be apparent to one skilled in the art that the claimed invention may be practiced using different details than the example ones described herein. In other instances, well-known features are omitted or simplified to clarify the description of the example implementations.

The inventor(s) intend the described example implementations to be primarily examples. The inventor(s) do not intend these example implementations to limit the scope of the appended claims. Rather, the inventor(s) have contemplated that the claimed invention might also be embodied and implemented in other ways, in conjunction with other present or future technologies.

Moreover, the word "example" is used herein to mean serving as an example, instance, or illustration. Any aspect or design described herein as "example" is not necessarily to be construed as preferred or advantageous over other aspects or designs. Rather, use of the word example is intended to present concepts and techniques in a concrete fashion. The term "techniques," for instance, may refer to one or more devices, apparatuses, systems, methods, articles of manufacture, and computer-readable instructions as indicated by the context described herein.

As used in this application, the term "or" is intended to mean an inclusive "or" rather than an exclusive "or." That is unless specified otherwise or clear from context, "X employs A or B" is intended to mean any of the natural inclusive permutations. That is if X employs A; X employs B; or X employs both A and B, then "X employs A or B" is satisfied under any of the preceding instances. Also, the articles "an" and "an" as used in this application and the appended claims should be construed to mean "one or more," unless specified otherwise or clear from context to be directed to a singular form.

These processes are illustrated as a collection of blocks in a logical flow graph, which represents a sequence of operations that can be implemented in mechanics alone or a combination of hardware, software, and firmware. In the context of software/firmware, the blocks represent instructions stored on one or more computer-readable storage media that, when executed by one or more processors, perform the recited operations.

Note that the order in which the processes are described is not intended to be construed as a limitation and any number of the described process blocks can be combined in any order to implement the processes or an alternate process. Additionally, individual blocks may be deleted from the processes without departing from the spirit and scope of the subject matter described herein.

The term "computer-readable media" is non-transitory computer-storage media. For example, non-transitory computer-storage media may include, but are not limited to, magnetic storage devices (e.g., hard disk, floppy disk, and magnetic strips), optical disks (e.g., compact disk (CD) and digital versatile disk (DVD)), smart cards, flash memory devices (e.g., thumb drive, stick, key drive, and SD cards), and volatile and non-volatile memory (e.g., random access memory (RAM), read-only memory (ROM)). Similarly, the term "machine-readable media" is non-transitory machine-storage media. Likewise, the term "processor-readable media" is non-transitory processor-storage media.

A non-transitory machine-readable storage medium can cause a machine to perform the functions or operations described, and includes any mechanism that stores information in a form accessible by a machine (e.g., computing device, electronic system, etc.), such as recordable/non-recordable media (e.g., read-only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface is configured by providing configuration parameters or sending signals to prepare the communication interface to provide a data signal describing the software content. The communication interface can be accessed via one or more commands or signals sent to the communication interface.

In the claims appended herein, the inventor(s) invoke 35 U.S.C. § 112(f) only when the words "means for" or "steps for" are used in the claim. If such words are not used in a claim, then the inventor(s) do not intend for the claim to be construed to cover the corresponding structure, material, or acts described herein (and equivalents thereof) in accordance with 35 U.S.C. 112(f).

A non-transitory machine-readable storage medium can cause a machine to perform the functions or operations described, and includes any mechanism that stores information in a form accessible by a machine (e.g., computing device, electronic system, etc.), such as recordable/non-recordable media (e.g., read-only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface is configured by providing configuration parameters or sending signals to prepare the communication interface to provide a data signal describing the software content. The communication interface can be accessed via one or more commands or signals sent to the communication interface.

What is claimed is:

1. A method of facilitation of orthotropic patterns during substrate fabrication, the method comprising:
    obtaining, by a scanning electron microscope (SEM), an image of a pattern of lines and spaces on a patterned substrate;
    measuring, by a processor, features of the lines of the pattern of the image obtained by the SEM, wherein the measured features include one or more line-independent features and one or more line-interdependent features;
    calculating, by the processor, an orthotopicness factor based, at least in part, on the one or more line-interdependent features and employing one or more line-interdependent constraints, wherein the orthotopicness factor is one of a plurality of predetermined values, wherein each predetermined value is indicative of a relative degree of orthotopicness of the pattern of lines and spaces of the image;
    updating a display with a visual representation of the calculated orthotopicness factor; and
    generating, based on the calculated orthotopicness factor, instructions to adjust substrate fabrication of a substrate fabrication system, wherein the generated instructions direct a sub-system of the substrate fabrication system to improve orthotopicness of a pattern of lines and space of a layer of another substrate during fabrication of the another substrate.

2. The method of claim 1 further comprising obtaining the patterned substrate after photolithography or pattern transfer, wherein the obtaining the image includes capturing the image of the patterned substrate.

3. The method of claim 1 further comprising:
    determining that a value of the calculated orthotopicness factor indicates that the pattern of lines and spaces on the patterned substrate falls outside of specified range of values to be considered intralayered aligned;
    in response to the determining, presenting an indication that the patterned substrate is misaligned.

4. The method of claim 1, wherein the patterned substrate includes a semiconductor wafer.

5. The method of claim 1, wherein the one or more line-interdependent features includes a pitch between lines.

6. The method of claim 1, wherein the one or more line-interdependent constraints is selected from a group consisting of lines being parallel to each other, lines having a consistent critical dimension (CD), lines having an equal pitch between adjacent lines, and a combination thereof.

7. The method of claim 1, wherein the one or more line-interdependent constraints includes lines being parallel to each other, lines having a consistent critical dimension (CD), and lines having an equal pitch between adjacent lines.

8. The method of claim 1, wherein the calculating includes simultaneously fitting of straight lines to detected edges with the one or more line-interdependent constraints.

9. A method of orthotropic pattern metrology during substrate fabrication, the method comprising:
- obtaining, by a scanning electron microscope (SEM), an image of a pattern of lines and spaces on a patterned substrate;
- detecting, by a processor, edges in the image obtained by the SEM;
- simultaneously fitting, by the processor, straight lines to adjacent pairs of the detected edges using one or more line-interdependent constraints;
- calculating, by the processor, orthotopicness factor based on the simultaneous fitting, wherein the orthotopicness factor is one of a plurality of predetermined values, wherein each predetermined value is indicative of a relative degree of orthotopicness of the pattern of lines and spaces of the image;
- updating a display with a visual representation of the calculated orthotopicness factor;
- generating, based on the calculated orthotopicness factor, instructions to adjust substrate fabrication of a substrate fabrication system, wherein the generated instructions direct a sub-system of the substrate fabrication system to improve orthotopicness of a pattern of lines and space of a layer of another substrate during fabrication of the another substrate.

10. The method of claim 9 further comprising obtaining the patterned substrate after photolithography or pattern transfer, wherein the obtaining the image includes capturing the image of the patterned substrate.

11. The method of claim 9, wherein the patterned substrate includes a semiconductor wafer.

12. The method of claim 9, wherein the one or more line-interdependent constraints is selected from a group consisting of lines being parallel to each other, lines having a consistent critical dimension (CD), lines having an equal pitch between adjacent lines, and a combination thereof.

13. The method of claim 9, wherein the one or more line-interdependent constraints includes lines being parallel to each other, lines having a consistent critical dimension (CD), and lines having an equal pitch between adjacent lines.

* * * * *